United States Patent [19]
Heijman et al.

[11] Patent Number: 4,900,709
[45] Date of Patent: Feb. 13, 1990

[54] METHOD OF PATTERNING SUPERCONDUCTING OXIDE THIN FILMS

[75] Inventors: Maritza G. J. Heijman; Peter C. Zalm, both of Eindhoven, Netherlands

[73] Assignee: U.S. Philips Corporation, New York, N.Y.

[21] Appl. No.: 219,519

[22] Filed: Jul. 15, 1988

[30] Foreign Application Priority Data

Jul. 21, 1987 [NL] Netherlands ................... 8701718

[51] Int. Cl.$^4$ ........................... B05D 3/06; B05D 5/12
[52] U.S. Cl. ........................................ 505/1; 427/62; 427/63; 427/43.1; 427/96
[58] Field of Search ............ 427/62, 63, 96, 43.1; 505/1, 818, 820, 730

[56] References Cited

U.S. PATENT DOCUMENTS

4,316,785  2/1982  Suzuki et al. ................... 427/63

OTHER PUBLICATIONS

Guruitch et al., "Preparation and Substrate Reaction of Superconducting Y-$B_a$-$C_u$-O Films", Appl. Phys. Lett., 51(13), pp. 1027-1029, Sep. 1987.

Lee et al., "Microprobe Characterization of Sputtered High Tc Superconducting Films on Silicon", AIP Conference Proceeding, No. 165, pp. 427-434, Nov. 1987.

Gao et al., "Interface Formation: High-Temperature Superconductors With Noble Metals, Reactive Transition Metals, and Semiconductors", AIP Conference Proceeding, No. 165, pp. 358-367, edited by Harper et al., Nov. 1987.

*Primary Examiner*—Richard Bueker
*Assistant Examiner*—Roy V. King
*Attorney, Agent, or Firm*—Norman N. Spain

[57] ABSTRACT

Method of applying in accordance with a pattern thin layers of oxidic superconductive material onto a substrate, it not being necessary to subject the superconductive material to mechanical or chemical treatments. At its surface the substrate is provided in accordance with a desired pattern with two different material compositions. The first composition is chosen such that the oxidic material applied thereon is superconductive at a desired surface temperature. The second composition is chosen such that the oxidic material applied thereon is not superconductive.

7 Claims, 1 Drawing Sheet

METHOD OF PATTERNING SUPERCONDUCTING OXIDE THIN FILMS

BACKGROUND OF THE INVENTION

The invention relates to a method of applying thin layers of oxidic superconductive material onto a substrate.

A method of applying thin layers of superconductive $(La_{1-x}SR_x)_2CuO_4$ (wherein x=0.03) onto a strontium titanate substrate by means of magnetron sputtering is described in an article by M.Suzuki and T.Murakami in the Japanese Journal of Applied Physics, Vol. 26 (4), pages L524–L525 (1987).

For the use of the superconductive materials in thin layers it is often desirable to have the possibility to apply the superconductive material in an accurately defined pattern, with, details as fine as possible, for example for use in semiconductor devices and sensors. Oxidic superconductive materials of the said type or of the group of which $YBa_2Cu_3O_{7-\delta}$ (wherein $\delta=0.3$) is a representative, have the property that they have a poor resistance against moisture, which is a disadvantageous property for the above purpose. The customary manner of producing patterned thin layers, in which first a thin layer is applied across the entire surface, whereafter this layer is formed in the desired pattern by means of a mask and by etching, is consequently not very suitable.

SUMMARY OF THE INVENTION

The invention has for its object to provide a method of applying thin layers of oxidic superconductive material in a pattern on a substrate, it not being necessary to subject the superconductive material after application to mechanical or chemical treatments.

According to the invention, this object is accomplished by a method in which the oxidic material is applied onto a substrate which, in accordance with a desired pattern, has at least two different material compositions at its surface, a first composition being chosen such that the oxidic material applied thereon is superconductive at a desired service temperature and a second temperature being chosen such that the same oxidic material applied thereon is not superconductive at said service temperature.

DETAILED DESCRIPTION OF THE INVENTION

Figure 1A:
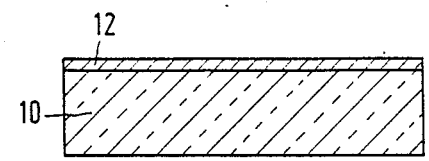
FIGS. 1a–c are sectional views showing steps in the method of the invention in which a negative image is found.

Applying the oxidic material can be effected in accordance with different suitable methods, for example by means of sputtering, magnetron sputtering, chemical vapour deposition vacuum coating.

In an embodiment of the method according to the invention the different material compositions at the surface are obtained by providing a substrate of the first composition with a thin layer of the second composition in accordance with a pattern. In that case the superconductive pattern constitutes the complement (negative image) of the patterned thin layer.

In a further embodiment of the method according to the invention, the different material compositions at the surface are obtained by providing a substrate of the second composition with a thin layer of the first composition in accordance with a pattern. In this case the superconductive pattern forms a positive image of the patterned thin layer.

Appropriate materials onto which the oxidic materials in superconductive form can be applied are strontium titanate and noble metals, preferably silver and gold.

Appropriate materials onto which the same oxidic materials in the non-superconductive form can be applied are silicon and aluminium oxide. A specific advantage of this choice of material is that therewith known methods from the field of manufacturing semiconductor devices can be used.

U.S. Pat. No. 4,255,474 discloses a method in which a thin layer of transparent material is modified in accordance with a pattern by means of diffusion of a previously applied material in accordance with a pattern. In the method of the invention a diffusion stage is not necessary, but the structure and/or composition on deposition is influenced by the substrate in such a manner that, depending on the local composition of that substrate, material is formed which is superconductive or not superconductive, as the case may be.

U.S. Pat. No. 4,290,843 discloses a method in which a crystalline substrate is locally disturbed by means of implantation, whereafter an epitaxial mono-crystalline layer is grown on the non-disturbed portions of the crystal surface. Simulaneously a polycrystalline layer, which is removed afterwards, is grown on the disturbed surface. The layers manufactured in accordance with the invention are not mono-crystalline, so that on applying the thin layer such a high degree of dependence of the composition and structure of the substrate is not obvious.

An alternative embodiment of the method of the invention for applying thin layers of oxidic, superconductive material on a substrate, a thin layer of an oxidic material being applied onto a substrate and being heated at an elevated temperature such that it is superconductive at a desired service temperature, is effected in the reverse sequence. To that end, the oxidic material is coated in accordance with a desired pattern, prior to heating the elevated temperature, with a thin layer of a composition which is chosen such that the subjacent material is not superconductive at said service temperature.

Strontium titanate is, for example, used as the substrate. During the thermal treatment, recrystallisation occurring, that portion of the oxidic material that contacts, for example, silicon or aluminum oxide is brought to such a state that it does not exhibit a superconductive behaviour at the desired service temperature.

Figure 1B:
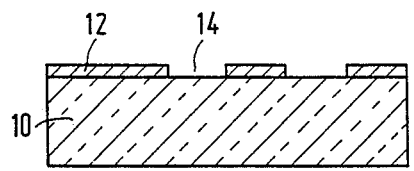
Figure 1C:
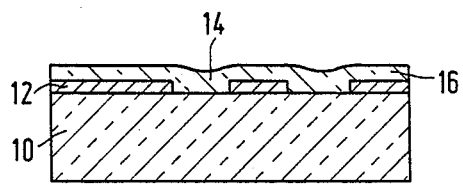
Figure 2A:
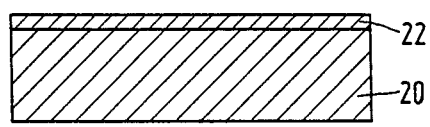
FIGS. 2a–c are sectional views showing steps in the method of the invention in which a positive image is found.
Figure 2B:
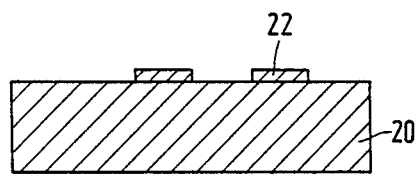
Figure 2C:
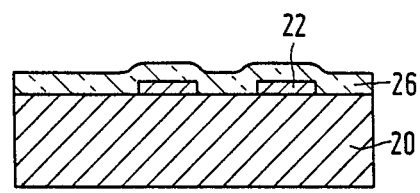

The invention will now be described by way of example with reference to the following embodiments and an accompanying drawing, FIG. 1a–c schematically illustrate a number of steps of an embodiment of the method according to the invention in which a negative image is formed, and in which FIG. 2a–c schematically illustrate a number of steps of an embodiment in accordance with the method of the invention in which a positive image is formed.

Embodiment 1

FIG. 1a shows a substrate 10 of SrTiO$_3$ which is coated with a silicon layer 12. Instead of silicon it is alternatively possible to use a layer of aluminum oxide. Apertures 14 are made in the silicon layer, so that the substrate material is locally laid bare, see FIG. 1b. This can be effected in any suitable manner, for example by coating the silicon layer with a photoresist, exposing this resist to light via a mask and to develop it thereafter, followed by local removal of the silicon layer in an etching procedure.

Thereafter a layer of oxidic material 16 of the composition YBa$_2$Cu$_3$O$_{6.7}$ is applied, for example by means of vacuum deposition, the substrate being kept at a temperature of 850° C. In the region of the apertures 14 the applied layer is superconductive at a temperature of approximately 90 K., in the region of the silicon layer 12 the applied layer is not superconductive at that temperature.

If so desired the layer 16 can further be coated with a protective layer to limit ambient influences to a minimum.

Substitutions can be effected in known manner in the said superconductive material without affecting the efficiency of the method of the invention. Thus, Y can be replaced, for example, wholly or partly by rare earth metal ions, Ba can be replaced by Sr or Ca, and O can partly be replaced by F.

Instead of by vapour deposition, the layer 16 can, for example, alternatively be applied by means of sputter deposition, using a pressed target plate of the desired composition. The substrate can be kept at a high temperature, for example from 800° to 800° C., but it is alternatively possible to effect deposition at a lower temperature. In that case a post-treatment is required, to obtain superconducting properties.

Embodiment 2

FIG. 2a shows a substrate 20 of silicon coated with a silver layer 22. Instead of silver of layer of gold or a layer of strontium titanate can, for example, alternatively be used. Apertures are made in the silver layer so that a pattern of silver conductors remain, see FIG. 2b, for example in the manner described in the preceding embodiment.

Thereafter a layer of oxidic material 26 is applied, for example in the manner described in the preceding embodiment and having the composition specified therein. On the sites of the silver conductors 22 the oxidic material is superconductive, in those places where the oxidic material is applied directly to the silicon substrate there is no superconductive behaviour.

The invention provides a simple manner for applying superconductive oxidic materials, in the form of a pattern, the definition of the pattern being effected before the superconductive material is applied. In this situation the phenomenon is utilised that a small disturbance of the composition and/or structure of the oxidic material is sufficient to ensure that the material is not superconductive at the desired temperature.

We claim:

1. A method of forming a patterned copper oxide based superconductor on a substrate operable at a particular service temperature comprising forming an exposed pattern of a first composition on the exposed surface of a second composition or forming an exposed pattern of said second composition on the exposed surface of said first composition wherein said first composition and said second composition are selected such that upon deposition of copper oxide based material under conditions necessary to form the superconductive properties, the region overlying said first composition forms a superconductive layer while the region overlying said second composition interacts under said depositing conditions in such a manner as to render the deposited copper oxide based superconductor material nonsuperconducting at the desired service temperature, applying said copper oxide based superconductive material to a surface containing both first and second compositions under conditions suitable to form the superconductive properties and obtaining a patterned substrate having a superconductive region overlying said first composition and a nonsuperconducting region overlying said second composition.

2. The method of claim 1 wherein the exposed areas of the first and second composition are formed by providing a portion of a surface of a substrate of said first composition with a thin layer of said second composition in accordance with a pattern.

3. The method of claim 1 wherein the exposed areas of the first and second compositions are formed by providing a portion of a surface of a substrate of said second composition with a thin layer of said first composition in accordance with a pattern.

4. A method as claimed in claim 1, characterized in that the first composition is strontium titanate.

5. A method as claimed in claim 1, characterized in that the first composition is a noble metal selected from the group consisting of silver and gold.

6. A method as claimed in claim 1, characterized in that the second composition is silicon.

7. A method as claimed in claim 1, characterized in that the second composition is aluminum oxide.

* * * * *